(12) United States Patent
Sun

(10) Patent No.: US 12,721,014 B2
(45) Date of Patent: Aug. 25, 2026

(54) DISPLAY PANEL AND MOBILE TERMINAL HAVING LIGHT EMISSION OPENINGS OF DIFFERENT AREAS

(71) Applicant: Wuhan China Star Optoelectronics Semiconductor Display Technology Co., Ltd., Wuhan (CN)

(72) Inventor: Jiajia Sun, Wuhan (CN)

(73) Assignee: Wuhan China Star Optoelectronics Semiconductor Display Technology Co., Ltd., Wuhan (CN)

( * ) Notice: Subject to any disclaimer, the term of this patent is extended or adjusted under 35 U.S.C. 154(b) by 1275 days.

(21) Appl. No.: 17/623,249

(22) PCT Filed: Dec. 17, 2021

(86) PCT No.: PCT/CN2021/139037
§ 371 (c)(1),
(2) Date: Jun. 15, 2023

(87) PCT Pub. No.: WO2023/103032
PCT Pub. Date: Jun. 15, 2023

(65) Prior Publication Data

US 2024/0040913 A1 Feb. 1, 2024

(30) Foreign Application Priority Data

Dec. 9, 2021 (CN) ......................... 202111496751.3

(51) Int. Cl.
*H10K 59/80* (2023.01)

(52) U.S. Cl.
CPC ......... *H10K 59/879* (2023.02); *H10K 59/873* (2023.02)

(58) Field of Classification Search
None
See application file for complete search history.

(56) References Cited

U.S. PATENT DOCUMENTS

2019/0165061 A1* 5/2019 Jung ..................... G06F 3/0446
2020/0227489 A1* 7/2020 Kim ....................... H10K 59/40
(Continued)

FOREIGN PATENT DOCUMENTS

CN 107665905 A 2/2018
CN 109148724 A 1/2019
(Continued)

OTHER PUBLICATIONS

Chinese Office Action issued in corresponding Chinese Patent Application No. 202111496751.3 dated Dec. 23, 2022, pp. 1-10.
(Continued)

*Primary Examiner* — Nduka E Ojeh
(74) *Attorney, Agent, or Firm* — PV IP PC; Christopher S. Ruprecht; Wei Te Chung

(57) ABSTRACT

The application discloses a display panel and a mobile terminal; the display panel includes a substrate, a light emission layer, a first refractive index layer, and a second refractive index layer, and the first refractive index layer includes multiple openings corresponding to multiple the luminescent pixels, and the second refractive index layer fills in the multiple openings, and the refractive index the second refractive index layer is greater than the refractive index of the first refractive index layer, and orthographic projections of the luminescent pixels cast on the first refractive index layer are located in the openings, and the areas of the openings to which luminescent pixels of different luminescent colors correspond are different.

14 Claims, 4 Drawing Sheets

(56) References Cited

U.S. PATENT DOCUMENTS

| | | | | |
|---|---|---|---|---|
| 2021/0013452 | A1 | 1/2021 | Kim et al. | |
| 2021/0050557 | A1* | 2/2021 | Yun | H10K 59/879 |
| 2021/0104702 | A1* | 4/2021 | Jung | H10K 59/122 |
| 2021/0234112 | A1* | 7/2021 | Seo | H05B 33/12 |
| 2023/0122736 | A1* | 4/2023 | Kim | H10K 50/865 257/40 |

FOREIGN PATENT DOCUMENTS

| | | | |
|---|---|---|---|
| CN | 111446379 | A | 7/2020 |
| CN | 113130608 | A | 7/2021 |
| CN | 113410408 | A | 9/2021 |
| CN | 113725385 | A | 11/2021 |
| WO | 2021119992 | A1 | 6/2021 |

OTHER PUBLICATIONS

International Search Report in International application No. PCT/CN2021/139037, mailed on Sep. 8, 2022.

Written Opinion of the International Searching Authority in International application No. PCT/CN2021/139037, mailed on Sep. 8, 2022.

* cited by examiner

DISPLAY PANEL AND MOBILE TERMINAL HAVING LIGHT EMISSION OPENINGS OF DIFFERENT AREAS

FIELD OF INVENTION

The present invention relates to the field of display technology, and more particularly to a display panel and a mobile terminal including the display panel.

BACKGROUND OF INVENTION

Currently, to reduce the power consumption of an OLED (Organic Light-Emitting Diode) display panel and to increase the efficiency of the OLED display panel, the panel manufacturers constantly propose new technologies. For example, geometrical optics has been applied to arrange a microlens pattern (MLP) in an OLED screen in order to have light that is relatively scattering as being emitted from the OLED screen converged onto exactly above the screen, and this is one of the effective measures for enhancing the light extraction efficiency of an OLED display panel.

Further, currently, the MLP structure to which each pixel of the display panel corresponds is identical. Since different colors have different luminescent intensities, the MLP structure of the current area is not applicable to luminescent materials of all colors and cannot further improve the efficiency of the OLED display panel.

Thus, it is desired to have a display panel to resolve the above technical issues.

SUMMARY OF INVENTION

The application provides a display panel and a mobile terminal for resolving the technical issue that the luminescent efficiency of the current display panel is relatively low.

The application proposes a display panel, which comprises:

a substrate:

a light emission layer, disposed on one side of the substrate, the light emission layer comprising multiple luminescent pixels;

a first refractive index layer, disposed on one side of the light emission layer, the first refractive index layer comprising multiple openings corresponding to multiple ones of the luminescent pixels; and a second refractive index layer, disposed on one side of the first refractive index layer that is distant from the substrate and filling in multiple ones of the openings, a refractive index of the second refractive index layer being greater than a refractive index of the first refractive index layer;

wherein orthographic projections of the luminescent pixels cast on the first refractive index layer are located in the openings, and the areas of the openings to which luminescent pixels of different luminescent colors correspond are different.

In the display panel of the application, the light emission layer comprises multiple first luminescent pixels that emit light of a first color, multiple second luminescent pixels that emit light of a second color, and multiple third luminescent pixels that emit light of a third color;

multiple ones of the openings comprise first openings, second openings, and third openings, the first openings corresponding to the first luminescent pixels, the second openings corresponding to the second luminescent pixels, the third openings corresponding to the third luminescent pixels;

wherein in a top plan view direction of the display panel, an area of the third openings is greater than an area of the first openings, and an area of the first openings is greater than an area of the second openings.

In the display panel of the application, a ratio between the area of the first openings and an area of the first luminescent pixels is a first ratio; a ratio between the area of the second openings and an area of the second luminescent pixels is a second ratio; a ratio between the area of the third openings and an area of the third luminescent pixels is a third ratio; and the second ratio is greater than or equal to the first ratio, and the first ratio is greater than or equal to the third ratio.

In the display panel of the application, the second ratio is in a range from 1.09 to 1.1; the first ratio is in a range from 1.07 to 1.09; the third ratio is in a range from 1.05 to 1.07.

In the display panel of the application, in the top plan view direction of the display panel, the first luminescent pixels and the first openings are of a same shape and a first spacing distance is present between the first luminescent pixels and the first openings;

the second luminescent pixels and the second openings are of a same shape and a second spacing distance is present between the second luminescent pixels and the second openings;

the third luminescent pixels and the third openings are of a same shape and a third spacing distance is present between the third luminescent pixels and the third openings; and the second spacing distance is greater than the first spacing distance, and the first spacing distance is greater than the third spacing distance.

In the display panel of the application, the third spacing distance is greater than or equal to 1.5 micrometers; the first spacing distance is greater than or equal to 2 micrometers; and the second spacing distance is greater than or equal to 3 micrometers.

In the display panel of the application, an inclination angle of the third openings is greater than an inclination angle of the first openings, and the inclination angle the first openings is greater than an inclination angle of the second openings.

In the display panel of the application, the first luminescent pixels are red luminescent pixels; the second luminescent pixels are green luminescent pixels; and the third luminescent pixels are blue luminescent pixels.

In the display panel of the application, the display panel further comprises:

an encapsulation layer, disposed between the light emission layer and the first refractive index layer, the encapsulation layer comprising an inorganic encapsulation layer bonded to the first refractive index layer, a refractive index of the inorganic encapsulation layer being greater than the refractive index of the first refractive index layer.

The application also proposes a mobile terminal, wherein the mobile terminal comprises a terminal body and a display panel, and the terminal body and the display panel are combined as a unity.

The application enhances the luminescent efficiency of the entire display panel by arranging the openings of different areas in the low refractive index film layer to correspond to the luminescent pixels, and setting up the opening areas according to the luminescent colors corresponding thereto so as to have luminescent pixels of different luminescent colors corresponding to openings of different areas, and to set light condensation effects enhanced with different colors to be identical.

DETAILED DESCRIPTION OF PREFERRED EMBODIMENTS

Figure 1:
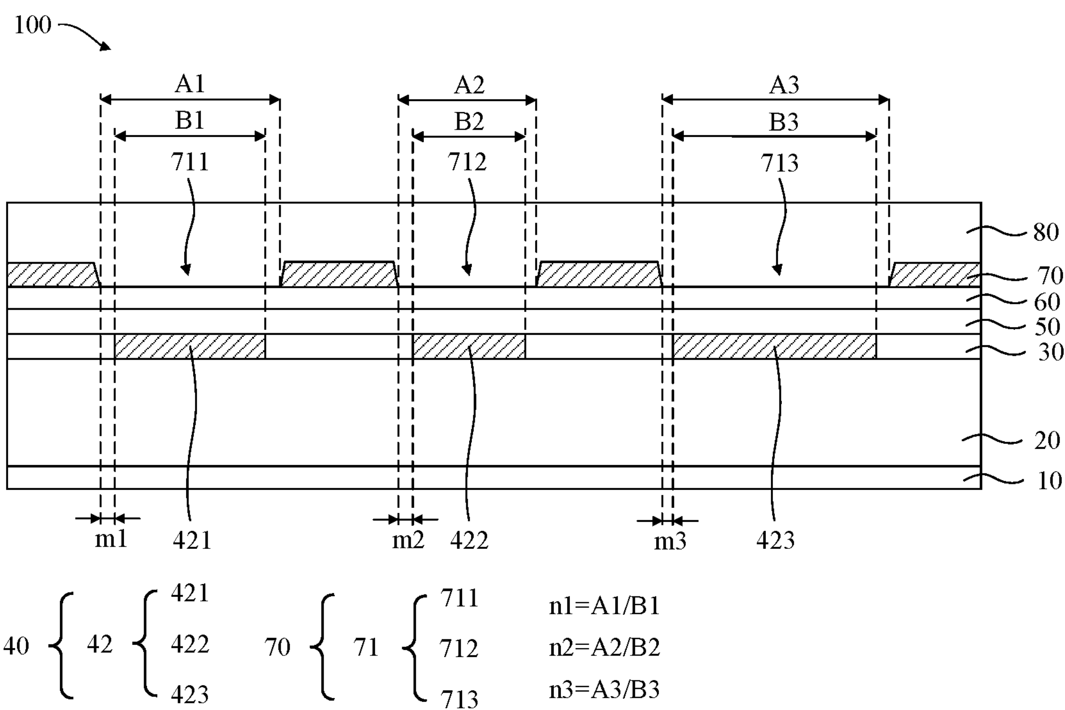
FIG. 1 is a first type cross-sectional view of a display panel of the application.

A more detailed description of the application will be provided below, based on embodiments thereof and with reference to the attached drawings, in order to make the purposes, technical solutions, and efficacy of the application more clear and more definite.

Referring to FIGS. 1-7, the application proposes a display panel 100, which comprises a substrate 10, a light emission layer 40, a first refractive index layer 70, and a second refractive index layer 80.

The light emission layer 40 is disposed on one side of the substrate 10, and the light emission layer 40 comprises multiple luminescent pixels 42; the first refractive index layer 70 is disposed on one side of the light emission layer 40, and the first refractive index layer 70 comprises multiple openings 71 corresponding to multiple ones of the luminescent pixels 42; the second refractive index layer 80 is disposed on one side of the first refractive index layer 70 that is distant from the substrate 10 and fills up multiple ones of the openings 71, and the refractive index of the second refractive index layer 80 is greater than the refractive index of the first refractive index layer 70.

In the instant embodiment, the orthographic projections of the luminescent pixels 42 cast on the first refractive index layer 70 are located in the openings 71, and the areas of the openings 71 that correspond to the luminescent pixels 42 of different luminescent colors are different.

The application discloses a display panel 100 and a mobile terminal; the display panel 100 comprises the substrate 10, the light emission layer 40 disposed on one side of the substrate 10, the first refractive index layer 70 disposed on one side of the light emission layer 40, the second refractive index layer 80 disposed on one side of the first refractive index layer 70 that is distant from the substrate 10, and the light emission layer 40 comprises multiple luminescent pixels 42, and the first refractive index layer 70 comprises multiple openings 71 corresponding to multiple ones of the luminescent pixels 42, and the second refractive index layer 80 fills up multiple ones of the openings 71, and the refractive index of the second refractive index layer 80 is greater than the refractive index of the first refractive index layer 70, and the orthographic projections of the luminescent pixels 42 cast on the first refractive index layer 70 are located in the openings 71, and the areas of the openings 71 that correspond to the luminescent pixels 42 of different luminescent colors are different; the application enhances the luminescent efficiency of the entire display panel 100 by arranging the openings 71 of different areas in the low refractive index film layer to correspond to the luminescent pixels 42, and setting up the opening areas according to the luminescent colors corresponding thereto so as to have luminescent pixels 42 of different luminescent colors corresponding to openings 71 of different areas, and to set light condensation effects enhanced with different colors to be identical.

Now, a description for the technical solution of the application will be provided, with reference to embodiments.

Figure 2:
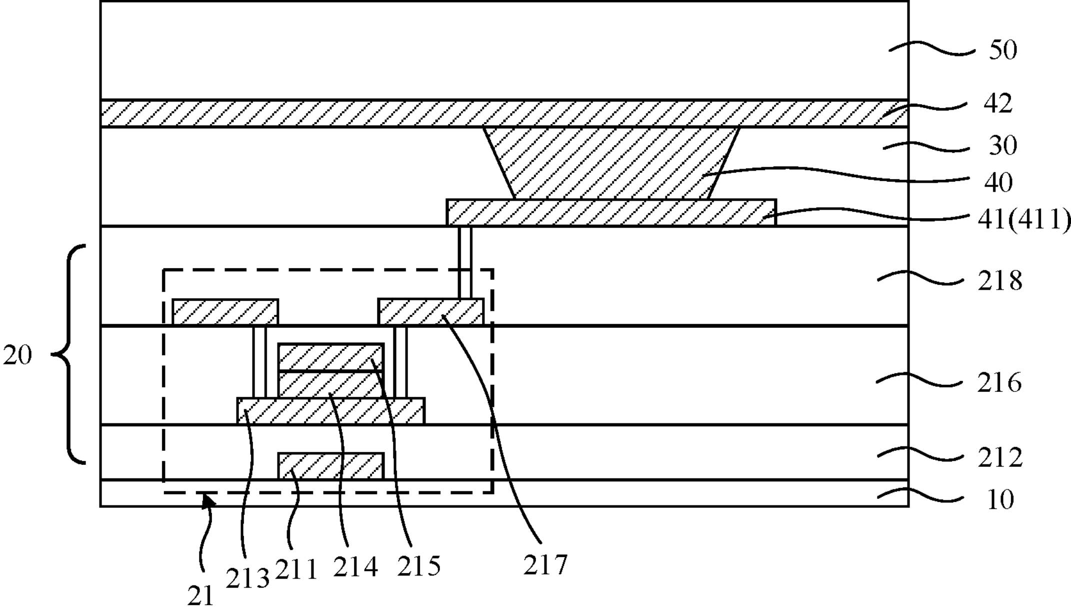
FIG. 2 is a second type cross-sectional view of a display panel of the application.

Referring to FIGS. 1 and 2, the display panel 100 may comprise a thin-film transistor array layer 20 disposed on the substrate 10, a pixel definition layer 30 disposed on the thin-film transistor array layer 20, a light emission layer 40 disposed on the same layer as the pixel definition layer 30, an encapsulation layer 50 disposed on the pixel definition layer 30, a touch control layer 60 disposed on the encapsulation layer 50, a first refractive index layer 70 disposed on the touch control layer 60, and a second refractive index layer 80 disposed on the first refractive index layer 70.

In the instant embodiment, the material of the substrate 10 can be materials of glass, quart, or polyimide.

In the instant embodiment, referring to FIG. 2, the thin-film transistor array layer 20 may comprise multiple thin-film transistors 21, and the thin-film transistors 21 can etch-stop type, or back channel etching type, or can be divided into structures of bottom-gate thin-film transistors and top-gate thin-film transistors according to the locations of the gate and the active layer, and no specific limit is imposed. For example, the thin-film transistors 21 shown in FIG. 1 are top-gate thin-film transistors, and the thin-film transistors 21 may comprise a light shielding layer 211 disposed on the substrate 10, a buffer layer 212 disposed the light shielding layer 211, an active layer 213 disposed on the buffer layer 212, a gate insulation layer 214 disposed on the active layer 213, a gate electrode layer 215 disposed on the gate insulation layer 214, an interlayer insulation layer 216 disposed on the gate electrode layer 215, a source-drain electrode layer 217 disposed on the interlayer insulation layer 216, and a planarization layer 218 disposed on the source-drain electrode layer 217.

In the instant embodiment, referring to FIG. 2, the display panel 100 may further comprise an anode layer 41 disposed on the planarization layer 218, a light emission layer 40 disposed on the anode layer 41, and a cathode layer 43 disposed on the light emission layer 40. The anode layer 41 comprises multiple anodes 411, and the pixel definition layer 30 comprises multiple pixel openings 301 that correspond, in a one to one manner, to multiple ones of the anodes 411, and each of the pixel openings 301 correspondingly exposes an upper surface of one anode 411, and the light emission layer 40 may comprise multiple luminescent pixels 42 that correspond, in a one to one manner, to multiple ones of the anodes.

In the instant embodiment, referring to FIGS. 1 and 2, the encapsulation layer 50 covers on the pixel definition layer 30, and continuously covers on multiple pixel openings 301 and multiple ones of the luminescent pixels 42; wherein the encapsulation layer 50 may at least comprises a first inorganic encapsulation layer 501, a first organic encapsulation layer 502, and a second inorganic encapsulation layer 503 stacked and disposed on the pixel definition layer 30.

In the instant embodiment, referring to FIGS. 1 and 2, the touch control layer 60 may comprise a first touch control metal layer and a second touch control metal layer disposed on the encapsulation layer 50 and an insulation layer disposed between the first touch control metal layer and the second touch control metal layer.

In the instant embodiment, the touch control layer 60 provided in the embodiments of the application can be of a mutual capacitance type or a self-capacitance type.

In the instant embodiment, if the touch control layer 60 is of a mutual capacitance type, then the first touch control metal layer may comprise multiple first electrodes and multiple second electrodes, and the multiple first electrodes are interconnected by means of first connection bridges located in the first touch control metal layer, and the multiple second electrodes are interconnected by means of second connection bridges located in the second touch control metal layer and extending through the insulation layer. If the touch control layer 60 is of a self-capacitance type, then the first touch control metal layer may comprise multiple touch control electrodes arranged in an array, while the second touch control metal layer may comprise multiple touch control wirings, and each of the touch control wirings is correspondingly connected to one of the touch control electrodes.

In the instant embodiment, when the touch control layer 60 is of a self-capacitance type, the touch control layer 60 may include only one metal layer, namely the metal layer comprises multiple touch control electrodes and multiple touch control wirings located between adjacent touch control electrodes, and each of the touch control wirings is connected to one of the touch control electrodes, and the above description is only made as an example of the embodiment of the application only, but not limited thereto, and a specific type and structure of the touch control layer 60 can be determined according to practical needs.

In the instant embodiment, referring to FIG. 1, the first refractive index layer 70 may be disposed on the touch control layer 60, and the first refractive index layer 70 covers a display zone of the display panel 100 and is extended to the non-display zone. The first refractive index layer 70 may comprise multiple openings 71 formed in the display zone, and each of the openings 71 corresponds, at an underside thereof, to one of the pixel openings 301, meaning each of the openings 71 corresponds one of the luminescent pixels 42, and the cross-sectional shape of the openings 71 can be arranged as an inverted trapezoidal form.

In the instant embodiment, referring to FIG. 1, the second refractive index layer 80 may be disposed on the first refractive index layer 70, the second refractive index layer 80 similarly covers the display zone and is extended to the non-display zone. The second refractive index layer 80 fills in the multiple openings 71, in order to form multiple microlens units in the multiple openings 71, in order to provide a light condensation effect for the luminescent pixels 42 corresponding thereto to enhance the light extraction effect of the luminescent pixels 42 corresponding thereto to thereby enhance the light extraction efficiency of the display panel 100.

In the instant embodiment, the refractive index of the second refractive index layer 80 may be greater than the refractive index the first refractive index layer 70. Large-angle light emitting from the luminescent pixels 42 is projected, from the encapsulation layer 50, into the openings 71 in the first refractive index layer 70 from, and is then projected to an interface between the first refractive index layer 70 and the second refractive index layer 80, and since the refractive index of the second refractive index layer 80 is greater than the refractive index the first refractive index layer 70, the large-angle light projected onto the interface between the first refractive index layer 70 and the second refractive index layer 80 is subject to total reflection to thus realize the light condensation effect of the luminescent pixels 42 corresponding thereto to enhance the light extraction effect of the luminescent pixels 42 corresponding thereto to thereby enhance the light extraction efficiency of the display panel 100.

In the instant embodiment, one opening 71 of the first refractive index layer 70 forms one microstructure that features the light condensation effect.

In the instant embodiment, the materials of the first refractive index layer and the second refractive index layer 80 can be materials of high light transmissivity, and the transmission rate is generally required to be greater than 90%, namely the transmission rates of the first refractive index layer 70 and the second refractive index layer 80 are far greater than the transmission rate (42%) of a regular polarizer, and by replacing a polarizer with such a material of high transmission rate, the light extraction efficiency of the display panel 100 can be effectively enhanced.

In the instant embodiment, the refractive index of the first refractive index layer 70 can be from 1.4 to 1.6, and the material of the first refractive index layer 70 may comprise a light-transmitting organic material that has a low refractive index. For example, the material of the first refractive index layer 70 can be acrylic resin, polyimide resin, polyamide resin, and/or Alq3 (tri(8-hydroxyquinolinato)aluminum).

In the instant embodiment, the refractive index of the second refractive index layer 80 can be from 1.61 to 1.8, and the material of the second refractive index layer 80 may comprise a light-transmitting organic material that has a high refractive index. For example, the material of the second refractive index layer 80 can be poly (3,4-ethylenedioxythiophene) (PEDOT), 4,4'-Bis[N-(3-methylphenyl)-N-phenylamino]biphenyl (TPD), 4,4,4"-tris[(3-methylphenyl) phenylamino]triphenylamine (m-MTDATA), 1,3,5-tris[N, N-bis(2-methylphenyl)-amino]benzene (o-MTDAB), 1,3,5-tris[N, N-bis(3-methylphenyl)-amino]benzene (m-MTDAB), 1,3,5-tris[N, N-bis(4-methylphenyl)-amino] benzene (p-MTDAB), 4,4'-bis[N, N-bis(3-methylphenyl)-amino]diphenylmethane (BPPM), 4,4-biscarbazolyl-1,1'-biphenyl (CBP), 4,4',4"-tris(N-carbazole)triphenylamine (TCTA), 2,2',2"-(1,3,5-benzinetriyl)-tris[1-phenyl-1H-benzimidazole] (TPBI) and/or 3-(Biphenyl-4-yl)-5-(4-tert-butylphenyl)-4-phenyl-4H-1,2,4-triazole (TAZ).

Figures 3, 4:
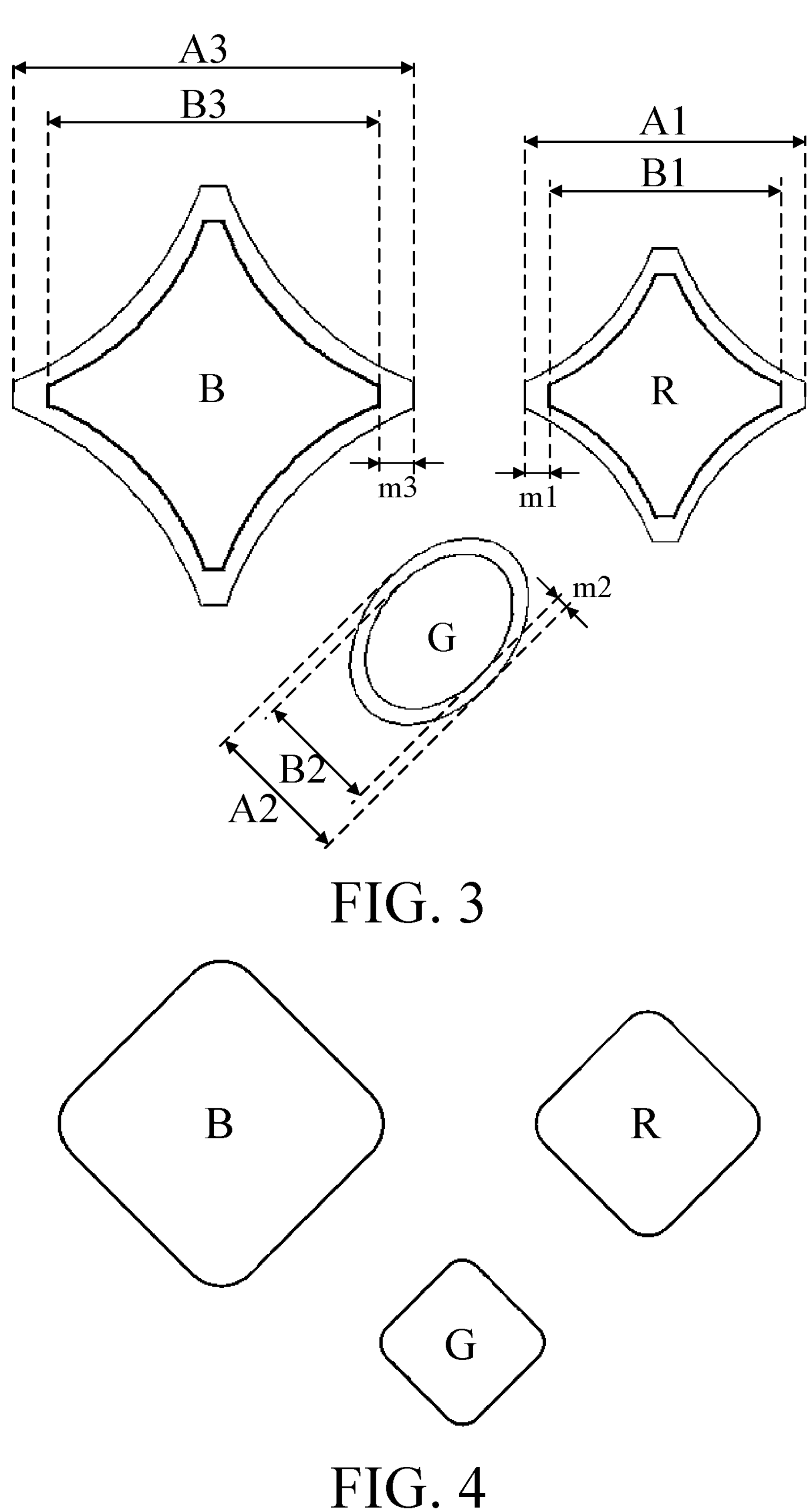
FIG. 3 is a first type top plan view of a display panel of the application.
FIG. 4 is a second type top plan view of a display panel of the application.

In the display panel 100 of the application, referring to FIGS. 1, 3, and 4, the light emission layer 40 may comprise multiple first luminescent pixels 421 that emit light of first color, multiple second luminescent pixels 422 that emit light of second color, and multiple third luminescent pixels 423 that emit light of third color; the multiple ones of the openings 71 comprises first openings 711, second openings 712, and third openings 713, and the first openings 711 correspond to the first luminescent pixels 421; the second openings 712 correspond to the second luminescent pixels 422; and the third openings 713 correspond to the third luminescent pixels 423.

In the instant embodiment, referring to FIGS. 3 and 4, in a top view direction of the display panel 100, the opening areas of the first openings 711, the second openings 712, and the third openings 713 are different.

In the instant embodiment, since the luminescent pixels 42 may emit one of red light, green light, or blue light, due to the inherent properties of luminescent materials, luminescent pixels 42 of different colors have different luminescent efficiencies and luminescence lives. Thus, to ensure homogeneity of the luminescence life and the luminescent efficiency for each of the luminescent pixels 42, the opening areas for the luminescent pixels 42 of different colors are set to be different, such as luminescent pixels 42 having a high luminescent efficiency and a long luminescence life being provided with a smaller opening area, and luminescent pixels 42 having a low luminescent efficiency and a short luminescence life being provided with a larger opening area, and also, the opening areas that correspond to the luminescent pixels 42 are similarly designated with different areas to ensure the openings 71 provide a positive effect for light condensation.

In the display panel 100 of the application, referring to FIGS. 1, 3, and 4, in a top view direction of the display panel 100, the opening area of the third openings 713 is greater than the opening area of the first openings 711, and the opening area of the first openings 711 is greater than the opening area of the second openings 712.

For example, the first luminescent pixels 421 can be red luminescent pixels; the second luminescent pixels 422 can be green luminescent pixels; and the third luminescent pixels 423 can be blue luminescent pixels. Since the luminescence life and the luminescent efficiency of the green luminescent pixels are the best, while the blue luminescent pixels and the luminescence life are the worst, the area B2 of the second luminescent pixels 422 and the area A2 of the second openings 712 to which the second luminescent pixels 422 correspond are the smallest; the area B3 of the third luminescent pixels 423 and the area A2 of the second openings 712 to which the third luminescent pixels 423 correspond are the largest; and the area B1 of the first luminescent pixels 421 and the area A1 of the first openings 711 to which the first luminescent pixels 421 correspond are between the two.

In the instant embodiment, to ensure the homogeneity of the luminescence life and the luminescent efficiency for the luminescent pixels 42 of the three colors of red, green, and blue, the application designs the light emission areas of the luminescent pixels 42 of the three different luminescent colors in different ways, and correspondingly, the openings 71 in the first refractive index layer 70 are also designed to have different areas, so that area of any one of the openings 71 corresponds to the area of a corresponding one of the luminescent pixels 42, in order to ensure that the openings 71 impose a positive effect on the light condensation of the luminescent pixels 42.

Figure 5:
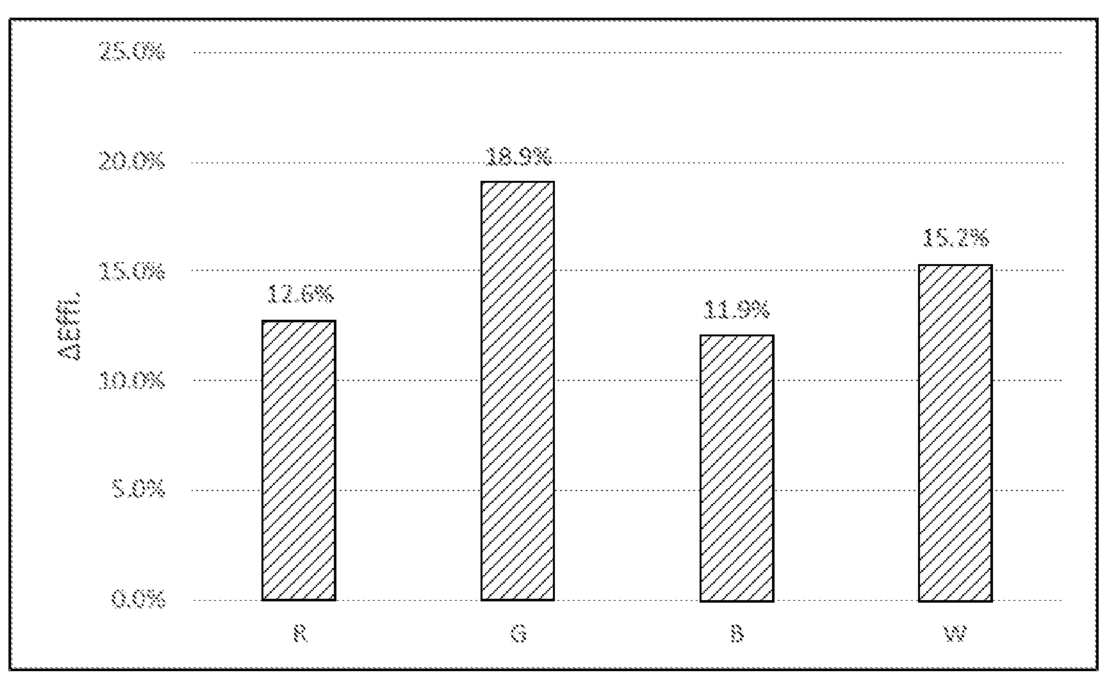
FIG. 5 is a chart showing enhancement of luminescent pixels of different colors by a microstructure in the display panel of the application.

Referring to FIG. 5, FIG. 5 is a chart showing enhancement of light emission pixels of different colors by a microstructure in a current display panel. In FIG. 5, each of the luminescent pixels 42 is spaced from the corresponding opening 71 by an identical distance. Experimental data reveal that since the luminescent intensity of the green luminescent pixels is the greatest, the enhancement percentage of the green luminescent pixels is the greatest, and the enhancement percentage of the green luminescent pixels is 18.9%; since the luminescent intensity of the blue luminescent pixels is the smallest, the enhancement percentage of the blue luminescent pixels is the smallest, and the enhancement percentage of the blue luminescent pixels is 11.9%; since the luminescent intensity of the red luminescent pixels is in the middle, the enhancement percentage of the red luminescent pixels is in the middle, and the enhancement percentage of the red luminescent pixels is 12.9%; the enhancement percentage of the white luminescent pixels 42 is an average of the three, and the enhancement percentage of the white luminescent pixels 42 is 15.2%.

It is known from the data of FIG. 5, although the microstructure of the current display panel 100 provides a certain effect of enhancement for the luminescent efficiency of the luminescent pixels 42, due to the luminescent intensities of different one of the luminescent pixels 42 being different, under a condition of constant difference of the openings 71, the enhancement effect is different for different luminescent pixels 42, and this eventually makes a mixed color greenish. Thus, although the microstructure provides a certain positive effect on light condensation for each of the luminescent pixels 42, since the degrees of enhancement that the microstructure imposes on luminescent pixels 42 of different colors are different, this similarly results in a negative effect on the display performance.

In the instant embodiment, referring to FIGS. 1, 3, and 4, the first openings 711 and the first luminescent pixels 421 are of the same shape, and a first spacing distance m1 is present between the first luminescent pixels 421 and the first openings 711; the second openings 712 and the second luminescent pixels 422 are of the same shape, and a second spacing distance m2 is present between the second openings 712 and the second luminescent pixels 422; the third openings 713 and the third luminescent pixels 423 are of the same shape, and a third spacing distance m3 is present between the third openings 713 and the third luminescent pixels 423; wherein the second spacing distance m2 is greater than the first spacing distance m1, and the first spacing distance m1 is greater than the third spacing distance m3.

Based on the above analysis, the instant embodiment sets up the spacing distances between the luminescent pixels 42 and the corresponding openings 71 in a differentiated way according to the differences of luminescent intensity among the luminescent pixels 42 of different colors, and the smaller the spacing distance between the luminescent pixels 42 and the openings 71, the greater the positive effect that the microstructure imposes on the luminescent pixels 42; and the larger the spacing distance between the luminescent pixels 42 and the openings 71, the weaker the positive effect that the microstructure imposes on the luminescent pixels 42; thus, since the luminescent intensity of the green luminescent pixels is the greatest, and the enhancement percentage of the green luminescent pixels is the greatest, it needs to set the second spacing distance m2 to be the greatest; since the luminescent intensity of the blue luminescent pixels is the smallest, and the enhancement percentage of the blue luminescent pixels is the smallest, it needs to set the third spacing distance m3 to be the smallest; since the luminescent intensity of the red luminescent pixels is in the middle, and the enhancement percentage of the red luminescent pixels is in the middle, the first spacing distance m1 is set in the middle.

The instant embodiment sets up the spacing distances between the luminescent pixels 42 and the corresponding openings 71 in a differentiated way according to the differences of luminescent intensity among the luminescent pixels 42, and by setting the third spacing distance m3 that corresponds to the smallest luminescent intensity to the smallest, and setting the second spacing distance m2 that corresponds to the greatest luminescent intensity to be the greatest, so as to make the degrees of enhancement that the microstructure imposes on the luminescent pixels 42 of different colors identical, to thereby realize positive enhancement of the display performance as a whole.

In the display panel 100 of the application, the microstructure generally condenses the large-angle outward-projecting light from the luminescent pixels 42 to a location exactly above the luminescent pixels 42 in order to achieve the effect of light condensation; however, if the spacing distance between the openings 71 and the corresponding luminescent pixels 42 is excessively small, the large-angle outward-projecting light cannot project into the openings 71, and consequently, the spacing distance between the openings 71 and the corresponding luminescent pixels 42 must be set greater than a threshold.

In the instant embodiment, the first spacing distance m1 can be greater than or equal to 2 micrometers; the second spacing distance m2 can be greater than or equal to 3 micrometers; and the third spacing distance m3 can be greater than or equal to 1.5 micrometers, and yet it is essential that the second spacing distance m2 be smaller than the first spacing distance m1, and the first spacing distance m1 be smaller than the third spacing distance m3.

Similarly, if the spacing distance between the openings 71 and the corresponding luminescent pixels 42 is excessively large, then the microstructure cannot fulfill the corresponding light condensation effect, and since among the first spacing distance m1, the second spacing distance m2, and the third spacing distance m3, the second spacing distance m2 is the greatest, it only needs to set the second spacing distance m2 to be smaller than or equal to 10 micrometers.

In the instant embodiment, in addition to arranging the luminescent pixels 42 in a differentiated manner by means of the spacing distances between the luminescent pixels 42 and the corresponding openings 71, differentiated arrangement of the luminescent pixels 42 may alternatively be achieved according to the differences of ratio between the area of the luminescent pixels 42 and the area of the corresponding openings 71.

In the display panel 100 of the application, referring to FIGS. 1, 3, and 4, the ratio between the area A1 of the first openings 711 and the area B1 of the first luminescent pixels 421 is a first ratio n1; the ratio between the area A2 of the second openings 712 and the area B2 of the second luminescent pixels 422 is a second ratio n2; and the ratio between the area A3 of the third openings 713 and the area B3 of the third luminescent pixels 423 is a third ratio n3; wherein the second ratio n2 is greater than or equal to the first ratio n1 and the first ratio n1 is greater than or equal to the third ratio n3.

Based on the above analysis, the instant embodiment sets up the ratio between the area of the luminescent pixels 42 and the area of the corresponding openings 71 in a differentiated way according to the differences of luminescent intensity among the luminescent pixels 42 of different colors, and the smaller the ratio between the area of the luminescent pixels 42 and the area of the openings 71, the stronger the positive effect that the microstructure imposes on the luminescent pixels 42; and the larger the ratio between the area of the luminescent pixels 42 and the area of the openings 71, the weaker the positive effect that the microstructure imposes on the luminescent pixels 42; thus, since the luminescent intensity of the green luminescent pixels is the greatest, and the enhancement percentage of the green luminescent pixels is the greatest, it needs to set the second ratio n2 to be the greatest; since the luminescent intensity of the blue luminescent pixels is the smallest, and the enhancement percentage of the blue luminescent pixels is the smallest, it needs to set the third ratio n3 to be the smallest; since the luminescent intensity of the red luminescent pixels is in the middle, and the enhancement percentage of the red luminescent pixels is in the middle, the first ratio n1 is set in the middle.

In the display panel 100 of the application, the microstructure generally condenses the large-angle outward-projecting light from the luminescent pixels 42 to a location exactly above the luminescent pixels 42 in order to achieve the effect of light condensation; however, if the ratio between the area of the openings 71 and the area of the corresponding luminescent pixels 42 is excessively small, the large-angle outward-projecting light cannot project into the openings 71, and consequently, the ratio between the area of the openings 71 and the area of the corresponding luminescent pixels 42 must be set greater than a threshold; and similarly, if the ratio between the area of the openings 71 and the area of the corresponding luminescent pixels 42 the area is excessively large, and the large-angle outward-projecting light cannot be projected onto the interface between the first refractive index layer 70 and the second refractive index layer 80, then the microstructure cannot fulfill the corresponding light condensation effect, and thus, the ratio between the area of the openings 71 and the area of the corresponding luminescent pixels 42 must be set smaller than a threshold.

In the instant embodiment, the range of the first ratio n1 is from 1.07 to 1.09; the range of the second ratio n2 is from 1.09 to 1.1; the range of the third ratio n3 is from 1.05 to 1.07.

Referring to the structures shown in FIGS. 3 and 4, FIG. 3 is a first type top plan structural view of the luminescent pixels 42 of the display panel 100 of the application, and FIG. 4 is a second type top plan structural view of the luminescent pixels 42 of the display panel 100 of the application. The luminescent pixels 42 in FIGS. 3 and 4 are of irregular shapes, and solely subjecting the shapes of the openings 71 to constraints imposed thereon by the ratio between the area of the openings 71 and the area of the corresponding luminescent pixels 42 or the spacing distance between the openings 71 and the corresponding luminescent pixels 42 would provide diversified possibilities for the shapes of the openings 71, and thus, in designing the openings 71, the instant embodiment may make it satisfy both the constraints of spacing distance and ratio provided above.

In the display panel 100 of the application, the luminescent pixels 42 emits large-angle outward-projecting light to get incident into the openings 71, and if an inclination angle of the interface between the first refractive index layer 70 and the second refractive index layer 80 is relatively small, then the large-angle outward-projecting light may not pass through the interface and is directly conducted outward through the second refractive index layer 80, and thus, the smaller the inclination angle of the openings 71, the poorer the light condensation effect of the microstructure; and the larger the inclination angle of the openings 71, the better the light condensation effect of the microstructure.

Figure 6:
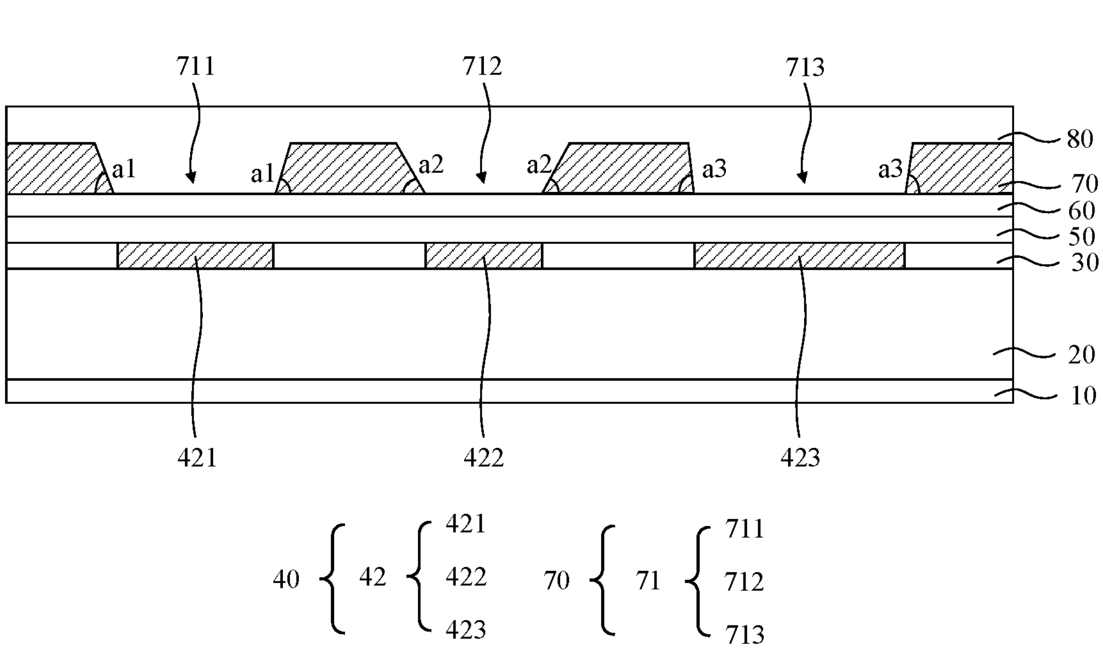
FIG. 6 is a third type cross-sectional view of a display panel of the application.

In the instant embodiment, referring to FIG. 6, the inclination angle a3 of the third openings 713 can be greater than the inclination angle a1 of the first openings 711, and the inclination angle a1 of the first openings 711 can be greater than the inclination angle a2 of the second openings 712.

Based on the above analysis, since the luminescent intensity of the green luminescent pixels is the greatest, and the enhancement percentage of the green luminescent pixels is the greatest, the inclination angle a2 of the second openings 712 is the smallest, and the light condensation effect of the second openings 712 on the green light is reduced; since the luminescent intensity of the blue luminescent pixels is the smallest, and the enhancement percentage of the blue luminescent pixels is the smallest, the inclination angle a3 of the third openings 713 is the greatest, and the light condensation effect of the third openings 713 on the blue light is enhanced; since the luminescent intensity of the red luminescent pixels is in the middle, and the enhancement percentage of the red luminescent pixels is in the middle, the inclination angle a1 of the first openings 711 is in the middle.

In the instant embodiment, no specific limitation is imposed for specific angles of the first openings 711, the second openings 712, and the third openings 713, provided the constraints are satisfied.

Figure 7:
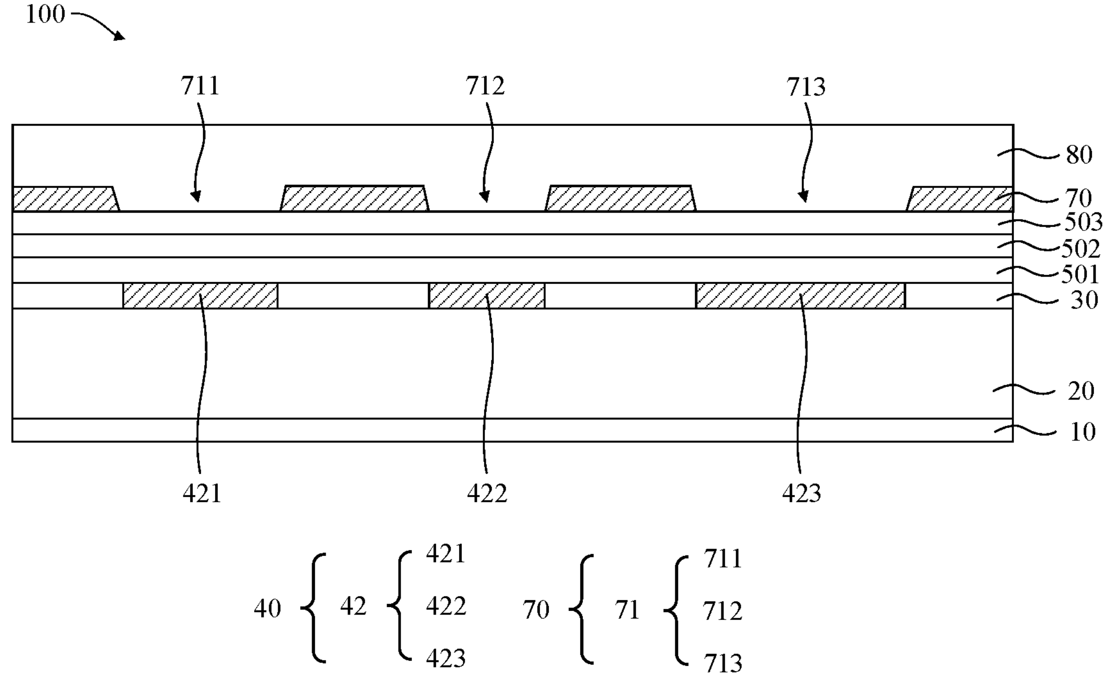
FIG. 7 is a fourth type cross-sectional view of a display panel of the application.

In the display panel 100 of the application, referring to FIG. 7, the encapsulation layer 50 may be disposed between the light emission layer 40 and the first refractive index layer 70, and the encapsulation layer 50 comprises a second inorganic encapsulation layer 503 that is directly bonded to the first refractive index layer 70, and the refractive index of the second inorganic encapsulation layer 503 is greater than the refractive index of the first refractive index layer 70.

In the instant embodiment, since light emitting from the luminescent pixels 42 must transmit through the encapsulation layer 50 first to then get into the first refractive index layer 70, when large-angle emitting from the luminescent pixels 42 travels from the second inorganic encapsulation layer 50 that is made of a high refractive index material into the first refractive index layer 70 that is made of a low refractive index material, the large-angle light under refraction and converts into small-angle light that condenses toward a center of the luminescent pixels 42 to further enhance the display performance of the display panel 100.

The application also proposes a mobile terminal, which comprises a terminal body and the above-described display panel, and the terminal body and the display panel are combined together as a unity. The terminal body can be a component, such as a circuit board, bonded to the display panel and a covering plate covering on the display panel. The mobile terminal may be an electronic device, including a mobile phone, a television, and a notebook computer.

The application discloses a display panel and a mobile terminal; the display panel comprises a substrate, a light emission layer disposed on one side of the substrate, a first refractive index layer disposed on one side of the light emission layer, a second refractive index layer disposed on one side of the first refractive index layer that is distant from the substrate, and the light emission layer comprises multiple luminescent pixels, and the first refractive index layer comprises multiple openings corresponding multiple ones of the luminescent pixels, and the second refractive index layer fills in multiple ones of the openings, and the refractive index of the second refractive index layer is greater than the refractive index of the first refractive index layer, and orthographic projections of the luminescent pixels cast on the first refractive index layer are located in the openings, and the areas of the openings to which the luminescent pixels of different luminescent color correspond are different; the application enhances the luminescent efficiency of the entire display panel by arranging the openings of different areas in the low refractive index film layer to correspond to the luminescent pixels, and setting up the opening areas according to the luminescent colors corresponding thereto so as to have luminescent pixels of different luminescent colors corresponding to openings of different areas, and to set light condensation effects enhanced with different colors to be identical.

It is appreciated that those having ordinary skill in the art may contemplate equivalent substitutions or variations based on the technical solution of the application and the inventive idea thereof, and such variations or substitutions all belong to the protection scope defined in the appended claims of the application.

What is claimed is:

1. A display panel, comprising:

a substrate;

a light emission layer, disposed on one side of the substrate, the light emission layer comprising multiple luminescent pixels;

a first refractive index layer, disposed on one side of the light emission layer, the first refractive index layer comprising multiple openings corresponding to multiple ones of the luminescent pixels; and a second refractive index layer, disposed on one side of the first refractive index layer that is distant from the substrate and filling in multiple ones of the openings, a refractive index of the second refractive index layer being greater than a refractive index of the first refractive index layer;

wherein orthographic projections of the luminescent pixels cast on the second refractive index layer are located in the openings, and the areas of the openings to which luminescent pixels of different luminescent colors correspond are different;

wherein the light emission layer comprises multiple first luminescent pixels that emit light of a first color, multiple second luminescent pixels that emit light of a second color, and multiple third luminescent pixels that emit light of a third color;

the openings comprise first openings, second openings, and third openings, the first openings corresponding to the first luminescent pixels, the second openings corresponding to the second luminescent pixels, the third openings corresponding to the third luminescent pixels;

wherein the first luminescent pixels are red luminescent pixels; the second luminescent pixels are green luminescent pixels; and the third luminescent pixels are blue luminescent pixels;

wherein, in a top plan view direction of the display panel, an area of each of the third openings is greater than an area of each of the first openings, and the area of each of the first openings is greater than an area of each of the second openings; and wherein a ratio between the area of the first opening and an area of the red luminescent pixel is a first ratio; a ratio between the area of the second opening and an area of the green luminescent pixel is a second ratio; a ratio between the area of the third opening and an area of the blue luminescent pixel is a third ratio; and the second ratio corresponding to the green luminescent pixel is greater than the first ratio corresponding to the red luminescent pixel, and the first ratio corresponding to the red luminescent pixel is greater than the third ratio corresponding to the blue luminescent pixel.

2. The display panel according to claim 1, wherein the second ratio is in a range from 1.09 to 1.1; the first ratio is in a range from 1.07 to 1.09; the third ratio is in a range from 1.05 to 1.07.

3. The display panel according to claim 1, wherein in the top plan view direction of the display panel, the first luminescent pixels and the first openings are of a same shape and a first spacing distance is present between the first luminescent pixels and the first openings;

the second luminescent pixels and the second openings are of a same shape and a second spacing distance is present between the second luminescent pixels and the second openings;

the third luminescent pixels and the third openings are of a same shape and a third spacing distance is present between the third luminescent pixels and the third openings; and the second spacing distance is greater than the first spacing distance, and the first spacing distance is greater than the third spacing distance.

4. The display panel according to claim 3, wherein the third spacing distance is greater than or equal to 1.5 micrometers; the first spacing distance is greater than or equal to 2 micrometers; and the second spacing distance is greater than or equal to 3 micrometers.

5. The display panel according to claim 1, wherein an inclination angle of the third openings is greater than an inclination angle of the first openings, and the inclination angle the first openings is greater than an inclination angle of the second openings.

6. The display panel according to claim 1, wherein the display panel further comprises:

an encapsulation layer, disposed between the light emission layer and the first refractive index layer, the encapsulation layer comprising an inorganic encapsulation layer bonded to the first refractive index layer, a refractive index of the inorganic encapsulation layer being greater than the refractive index of the first refractive index layer.

7. The display panel according to claim 6, wherein the display panel further comprises:

a touch control layer, comprising a first touch control metal layer and a second touch control metal layer disposed on the encapsulation layer, and an insulation layer disposed between the first touch control metal layer and the second touch control metal layer.

8. A mobile terminal, wherein the mobile terminal comprises a terminal body and a display panel, the terminal body and the display panel being combined as a unity; wherein the display panel comprises:

a substrate;

a light emission layer, disposed on one side of the substrate, the light emission layer comprising multiple luminescent pixels;

a first refractive index layer, disposed on one side of the light emission layer, the first refractive index layer comprising multiple openings corresponding to multiple ones of the luminescent pixels; and a second refractive index layer, disposed on one side of the first refractive index layer that is distant from the substrate and filling in multiple ones of the openings, a refractive index of the second refractive index layer being greater than a refractive index of the first refractive index layer;

wherein orthographic projections of the luminescent pixels cast on the second refractive index layer are located in the openings, and the areas of the openings to which luminescent pixels of different luminescent colors correspond are different;

wherein the light emission layer comprises multiple first luminescent pixels that emit light of a first color, multiple second luminescent pixels that emit light of a second color, and multiple third luminescent pixels that emit light of a third color;

the openings comprise first openings, second openings, and third openings, the first openings corresponding to the first luminescent pixels, the second openings corresponding to the second luminescent pixels, the third openings corresponding to the third luminescent pixels;

wherein the first luminescent pixels are red luminescent pixels; the second luminescent pixels are green luminescent pixels; and the third luminescent pixels are blue luminescent pixels;

wherein, in a top plan view direction of the display panel, an area of each of the third openings is greater than an area of each of the first openings, and the area of each of the first openings is greater than an area of each of the second openings; and wherein a ratio between the area of the first opening and an area of the red luminescent pixel is a first ratio; a ratio between the area of the second opening and an area of the green luminescent pixel is a second ratio; a ratio between the area of the third opening and an area of the blue luminescent pixel is a third ratio; and the second ratio corresponding to the green luminescent pixel is greater than the first ratio corresponding to the red luminescent pixel, and the first ratio corresponding to the red luminescent pixel is greater than the third ratio corresponding to the blue luminescent pixel.

9. The mobile terminal according to claim 8, wherein the second ratio is in a range from 1.09 to 1.1; the first ratio is in a range from 1.07 to 1.09; the third ratio is in a range from 1.05 to 1.07.

10. The mobile terminal according to claim 8, wherein in the top plan view direction of the display panel, the first luminescent pixels and the first openings are of a same shape and a first spacing distance is present between the first luminescent pixels and the first openings;

the second luminescent pixels and the second openings are of a same shape and a second spacing distance is present between the second luminescent pixels and the second openings;

the third luminescent pixels and the third openings are of a same shape and a third spacing distance is present between the third luminescent pixels and the third openings; and the second spacing distance is greater than the first spacing distance, and the first spacing distance is greater than the third spacing distance.

11. The mobile terminal according to claim 10, wherein the third spacing distance is greater than or equal to 1.5 micrometers; the first spacing distance is greater than or equal to 2 micrometers; and the second spacing distance is greater than or equal to 3 micrometers.

12. The mobile terminal according to claim 8, wherein an inclination angle of the third openings is greater than an inclination angle of the first openings, and the inclination angle the first openings is greater than an inclination angle of the second openings.

13. The mobile terminal according to claim 8, wherein the display panel further comprises:

an encapsulation layer, disposed between the light emission layer and the first refractive index layer, the encapsulation layer comprising an inorganic encapsulation layer bonded to the first refractive index layer, a refractive index of the inorganic encapsulation layer being greater than the refractive index of the first refractive index layer.

14. The mobile terminal according to claim 13, wherein the display panel further comprises:

a touch control layer, comprising a first touch control metal layer and a second touch control metal layer disposed on the encapsulation layer, and an insulation layer disposed between the first touch control metal layer and the second touch control metal layer.

* * * * *